United States Patent

Okuda

[11] Patent Number: 5,909,915
[45] Date of Patent: Jun. 8, 1999

[54] RESIN-MOLDED ELECTRONIC CIRCUIT DEVICE

[75] Inventor: Hiroshi Okuda, Himeji, Japan

[73] Assignee: Mitsubishi Denki Kabushiki Kaisha, Tokyo, Japan

[21] Appl. No.: 08/648,869

[22] Filed: May 16, 1996

Related U.S. Application Data

[63] Continuation of application No. 08/266,775, Jun. 29, 1994, abandoned.

[30] Foreign Application Priority Data

Jul. 5, 1993 [JP] Japan .................................... 5-165675

[51] Int. Cl.$^6$ .............................. H05K 3/30; H05K 1/11; H01R 23/68
[52] U.S. Cl. ........................... 29/841; 174/52.5; 361/784; 361/785
[58] Field of Search ........................ 29/841; 264/272.14, 264/272.13, 272.17

[56] References Cited

U.S. PATENT DOCUMENTS

| | | | |
|---|---|---|---|
| 4,337,182 | 6/1982 | Needham | 264/272.17 X |
| 4,632,798 | 12/1986 | Eickman et al. | . |
| 4,720,424 | 1/1988 | Eickman et al. | . |
| 4,826,896 | 5/1989 | Procter | 264/272.13 X |
| 4,842,800 | 6/1989 | Walles et al. | 264/272.13 |
| 4,961,107 | 10/1990 | Geist et al. | . |
| 5,158,735 | 10/1992 | Procter | 264/272.17 |
| 5,216,283 | 6/1993 | Lin | . |
| 5,249,101 | 9/1993 | Frey et al. | 264/272.17 X |
| 5,313,365 | 5/1994 | Pennisi et al. | 174/52.2 |
| 5,424,251 | 6/1995 | Sono et al. | 264/272.17 X |

FOREIGN PATENT DOCUMENTS

| | | | |
|---|---|---|---|
| 182077 | 11/1986 | Japan | . |
| 2-281787 | 11/1990 | Japan | 361/785 |
| 4135166 | 12/1992 | Japan | . |
| 2086134 | 5/1982 | United Kingdom | 264/272.17 |

*Primary Examiner*—Carl J. Arbes
*Attorney, Agent, or Firm*—Sughrue, Mion, Zinn, Macpeak & Seas, PLLC

[57] ABSTRACT

A resin-molded electronic circuit device is provided with a protection resin molded with covering electronic components and an electronic circuit substrate and having almost the same coefficient of thermal expansion as that of a metal forming the electronic components and the electronic circuit substrate, and a connector mounted at an end of the protection resin and functioning as an external connecting terminal of the electronic circuit substrate. Since a case for housing the protection resin is unnecessary, it is possible to decrease the number of components and man-hours, and enhance the outside appearance of the electronic circuit device.

4 Claims, 3 Drawing Sheets

RESIN-MOLDED ELECTRONIC CIRCUIT DEVICE

This is a Continuation of U.S. patent application Ser. No. 08/266,775 filed Jun. 29, 1994 now abandoned.

BACKGROUND OF THE INVENTION

1. Field of the Invention

The present invention relates to a resin-molded electronic circuit device, method for making the device. More particularly, invention relates to a resin-molded electronic circuit device in which an electronic circuit substrate having electronic components mounted thereon is covered with resin for protection.

2. Description of the Related Art

For example, in an electronic circuit device used in an ignition device of a two-wheeled vehicle for controlling the ignition time, electronic components, an electronic circuit substrate and so on mounted inside are covered with resin to be protected from water, vibrations and so on.

FIGS. 4 and 5 are respectively plan and sectional views of such a conventional resin-molded electronic circuit device. Referring to the figures, a plastic case 1 is provided with openings on the top and front surfaces, and attachment portions 1a and 1a' on the right and left sides thereof. A connector 4 as an external connecting terminal is connected to an electronic circuit substrate 2 having electronic components 3 mounted thereon. This connector 4 has terminal portions 4a surrounded by a protecting portion 4b made of plastic, and is attached to the front side of the case 1 through the protecting portion 4b to cover the front side of the case 1.

A protection resin 5 is filled into the case 1 in which the electronic circuit substrate 2 and the electronic components 3 through the electronic circuit substrate 2 are positioned and the connector 4 is attached to the front side thereof. The electronic circuit substrate 2 and the electronic components 3 are protected from outside moisture and so on by the protection resin 5, and fixed to reduce vibrations. The electronic circuit substrate 2, the electronic components 3, the connector 4 and the protection resin 5 constitute an electronic circuit device 10.

The production method of the electronic circuit device 10 will now be described. After the terminal portions 4a of the connector 4 are connected by soldering or the like to the electronic circuit substrate 2 to which the electronic components 3 are fixed by soldering or the like, the electronic circuit substrate 2 is positioned in the case 1 and the connector 4 is mounted to the front side of the case 1. Then, a resin material is injected and filled into the case 1 and the case 1 filled with the resin material is heated in a furnace to set the resin material, thereby forming the protection resin 5. In this case, since the coefficient of thermal expansion of the protection resin 5 is different from that of metallic portions of the electronic components, (e.g., reads) if the temperature changes, stresses are produced in soldered portions of the electronic components 3 and the electronic circuit substrate 2. In order to reduce the stresses as much as possible, the protection resin 5 is made of a resin material having flexibility.

in the electronic circuit device 10, it is essential to inject the resin material into the case and limit the change in shape of the flexible protection resin 5 to some extent. though it can be thought of that the electronic components 3 and are covered with the protection resin 5 without the case 1 by injecting the resin material into a metal mold under pressure, such pressure injection is not appropriate since it damages the electronic components 3 and when the resin material is injected under pressure.

However, since the above conventional electronic circuit device 10 needs the case 1, the number of components and the number of operation man-hours are increased, and the protection resin 5 typically leaks out from an opening between the connector 4 and the case 1, thereby impairing the outward appearance of the electronic circuit device 10. Furthermore, when the resin material is injected into the case 1, air bubbles form under the electronic circuit substrate 2 and the electronic components, 3 and have a bad influence on the electronic components 3. Still furthermore, when the case 1 filled with the resin material is carried to the furnace, the resin material spills from the case 1. In order to eliminate the above disadvantages, the production of the electronic circuit device 10 needs more man-hours.

Therefore, it is required that such electronic circuit device 10 does not need the case 1.

SUMMARY OF THE INVENTION

The present invention aims to solve the above problems, and an object of the present invention is to provide a resin-molded electronic circuit device without a case for protection resin.

In order to achieve the above object, there is provided a resin-molded electronic circuit device comprised of an electronic circuit substrate having electronic components mounted thereon, a protection resin molded with to cover the electronic components and the electronic circuit substrate and having almost the same coefficient of thermal expansion as that of a metal forming the electronic components and the electronic circuit substrate, and a connector mounted at an end of the protection resin and functioning as an external connecting terminal of the electronic circuit substrate.

DESCRIPTION OF THE PREFERRED EMBODIMENT

An embodiment of the present invention will now be described with reference to the drawings.

Figure 1:
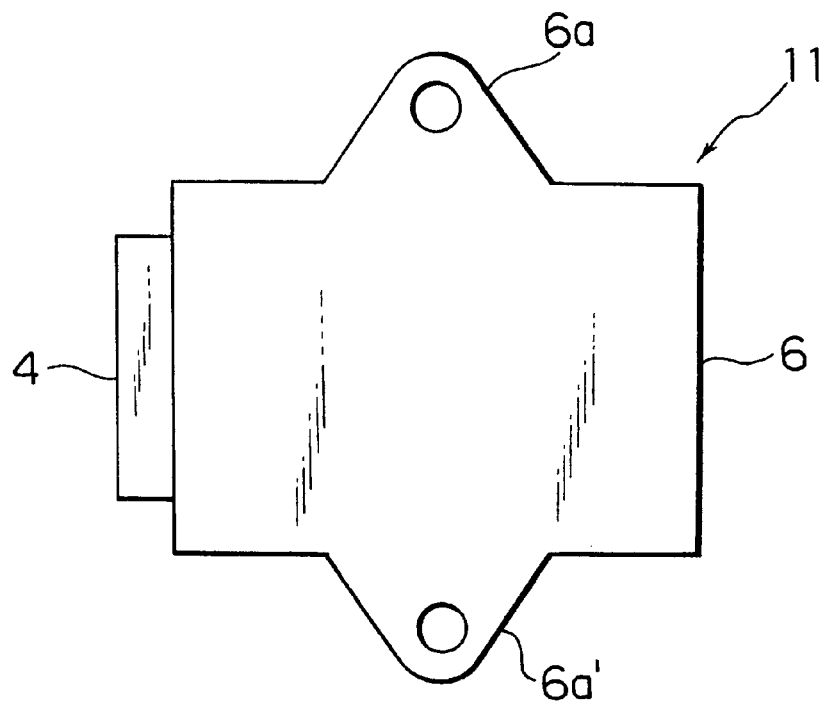
FIG. 1 is a plan view showing an electronic circuit device according to an embodiment of the present invention.
Figure 2:
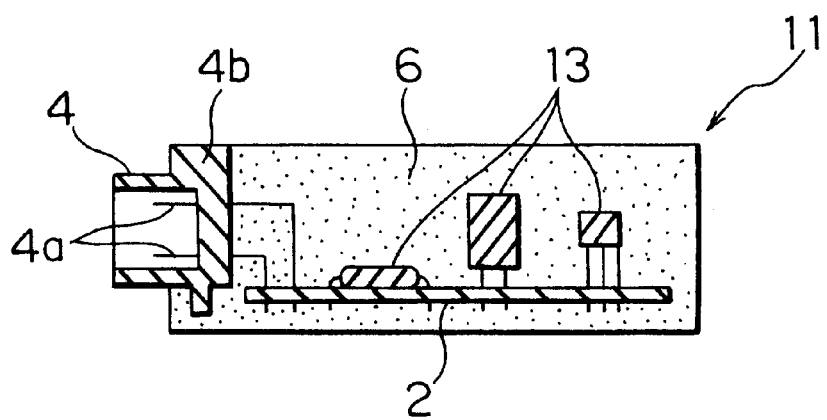
FIG. 2 is a sectional side view of the electronic circuit device shown in FIG. 1.
Figure 4:
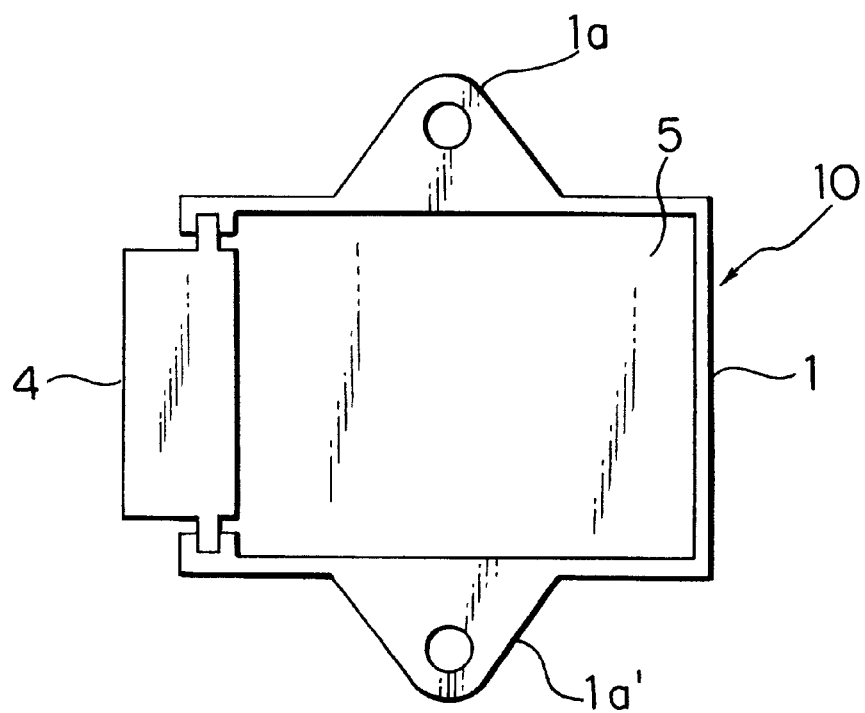
FIG. 4 is a plan view showing an example of a conventional electronic circuit device.
Figure 5:
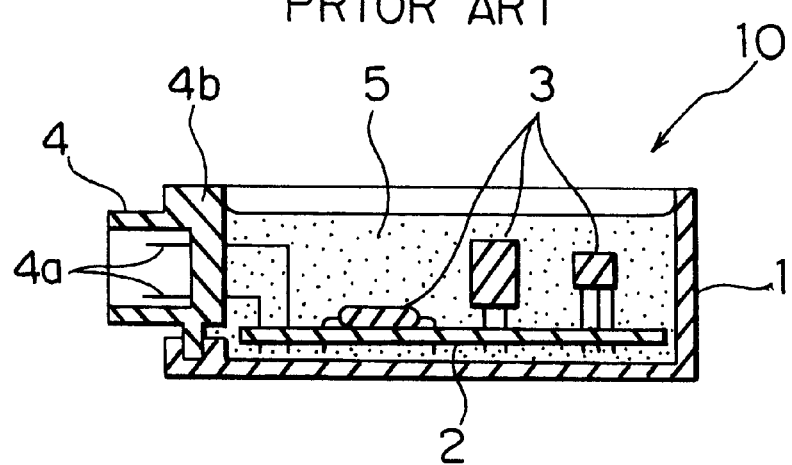
FIG. 5 is a sectional side view of the electronic circuit device shown in FIG. 4.

FIGS. 1 and 2 are respectively plan and sectional side views of an electronic circuit device according to an embodiment of the present invention. The similar or corresponding components to those of the electronic circuit device 10 shown in FIGS. 4 and 5 are denoted by the same numerals and the description thereof is omitted.

Referring to the figures, a protection resin 6 covers the outer surfaces of an electronic circuit substrate 2 and electronic components 3 mounted on the electronic circuit substrate 2, and integrally combines the electronic circuit substrate 2 and a connector 4 connected to the electronic circuit substrate 2 through terminal portions 4a. The protection resin 6 contains a main resin agent made of a mixture of, for example, epoxy resin and inorganic powders, and a thermosetting resin material mixed with a setting agent setting the main resin agent. The protection resin 6 is not easy to elastically deform and has a fixed hardness, and the coefficient of thermal expansion thereof is limited so as to be almost the same as that of a metal forming the electronic circuit substrate 2 and the electronic components 3. Since a great amount of inorganic powders are added to the main resin agent to limit the coefficient of thermal expansion, the protection resin 6 keeps its sticky paste state even when applied with the setting agent, and therefore, is not suited to be poured into the case 1 and The electronic circuit substrate 2, the electronic components 3, the connector 4, and the protection resin 6 constitute an electronic circuit device 11. The protection resin 6 is provided with attachment portions 6a and 6a' to attach the electronic circuit device 11 to another device.

Figure 3:
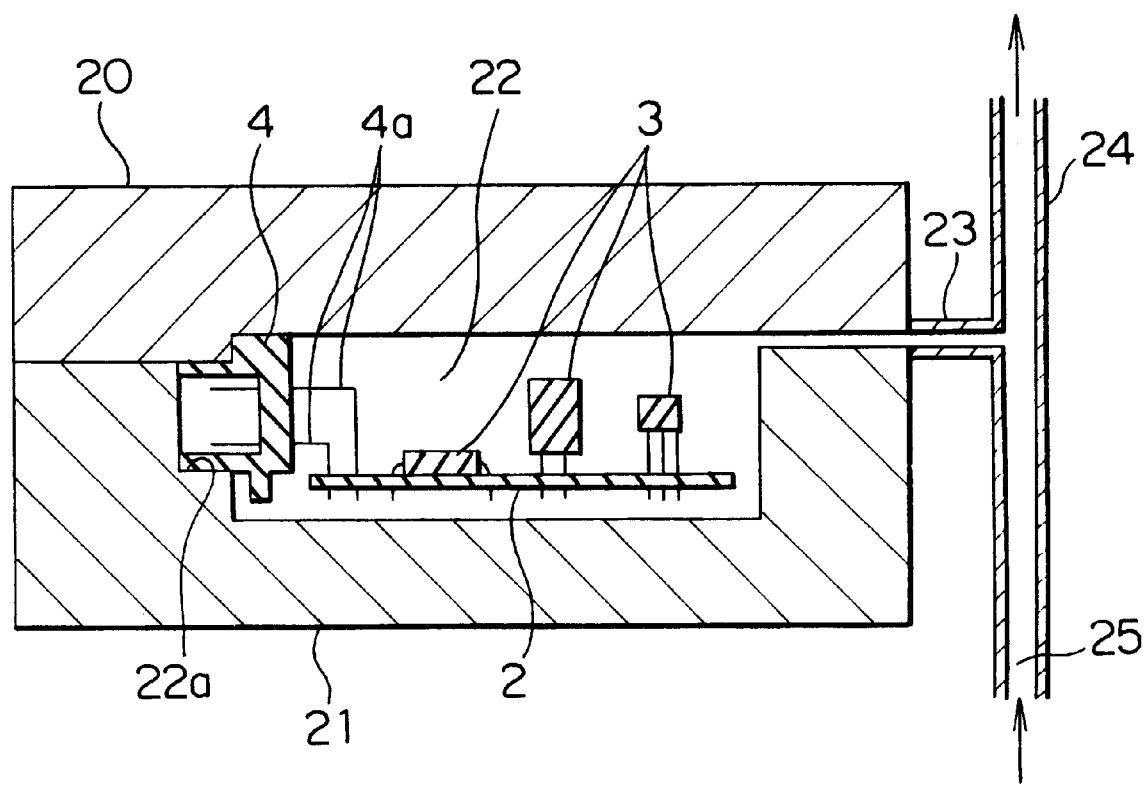
FIG. 3 is a sectional view of the principal part of a low pressure molding device for molding the protection resin of the electronic circuit device shown in FIG. 1.

The molding method of the protection resin 6 of the electronic circuit device 11 will now described with reference to FIG. 3. FIG. 3 is a sectional view of the principal part of a low pressure molding device for molding the protection resin 6 in low pressure molding. Referring to the figure, the low pressure molding device is comprised of an upper mold 20, a lower mold 21, a space portion 22 formed by the upper and lower molds 20 and 21 for injection of a resin material thereinto, a passage 23, an air exhaust path 24 for evacuating the space portion 22 and, and a resin material introduction path 25 for introducing the resin material to the space portion 22.

First, the electronic circuit substrate 2 having the electronic components 3 thereon is horizontally positioned in the lower part of the space portion 22, and the connector 4 connected to the electronic circuit substrate 2 through the terminal portions 4a is positioned in an engaging portion 22a formed at one end of the space portion 22. Then, the resin material the air in the introduction path 25 is temporarily sealed, and space portion 22 is evacuated through the passage 23 and the air exhaust path 24. When the pressure in the space portion 22 and is reduced to a predetermined vacuum pressure, the air exhaust path 24 is also made airtight, and the upper and lower molds 20 and 21 are heated to, for example, a temperature of 150° C. and held in this state in order to set a resin material to be injected into the space portion 22.

The resin material is injected from the resin material introduction path 25 into the space portion 22 through the passage 23. In this case, though the resin material is, as mentioned above, a mixture of a main resin agent containing epoxy resin mixed with a lot of inorganic powders and a setting agent for setting the main resin agent, and shows a paste state, since the inside of the space portion 22 is held in a vacuum state, the resin material is introduced into the space portion 22 under low pressure. The resin material reaches every portion of the electronic circuit substrate 2, the electronic components 3 and the connector 4, and is filled into the space portion 22 without making any void. The resin material is set in a short time by heat from the upper and lower molds 20 and 21 and forms the protection resin 6, thereby completing the resin-molded electronic circuit device 11.

As described above, since the protection resin 6 is molded by low pressure molding for introducing the resin material into the space portion 22 in a vacuum state, even the sticky and paste resin material is injected into every portion of the space portion 22 under low pressure. Therefore, it is possible to cover the electronic circuit substrate 2, the electronic components 3 and so on with the protection resin 6, whose coefficient of thermal expansion is almost the same as that of metal portions forming the above components, without damaging the electronic components 3 and so on.

Accordingly, since the protection resin 6 expands and contracts by the same amount as that of the metal portions of the electronic circuit substrate 2 and the electronic components 3, even if the temperature in the electronic circuit device 11 changes, no stress and cracks arise in the metal portions of the electronic components 3 and soldered portions between the electronic components 3, the electronic circuit substrate 2 and. Since the protection resin 6 cannot easily be elastically deformed and has a fixed hardness, even if vibrations and are applied to the electronic circuit device 11, the soldered and metal portions and are not cracked by stress.

Furthermore, since the case 1 is unnecessary in the electronic circuit device 11, the number of components and man-hours can be smaller than that of the conventional electronic circuit device 10, and the outside appearance thereof is enhanced. Still furthermore, the number of air bubbles are produced in the case 1 is drastically reduced, and the resin material is not likely to spill from the case 1 during the transportation of the case 1.

As described above, the protection resin does not need a case for molding the protection resin, the number of components and man-hours can be reduced, and the outside appearance is enhanced. Furthermore, it is possible to prevent the electronic components and soldered portions between the electronic components and the electronic circuit substrate from being damaged incident to the change in temperature. Still furthermore, the electronic circuit device can be easily attached to other devices through the attachment portions made of the protection resin.

What is claimed is:

1. A resin-molded electronic circuit device, comprising:

an electronic circuit substrate having electronic components mounted thereon, said substrate and at least one of said components having metal portions to conduct electric current; and protection resin means molded to cover said electronic components and said electronic circuit substrate and having a coefficient of thermal expansion substantially equal to the coefficient of thermal expansion of said metal portions, for covering and sealing said electronic components and said substrate and for expanding and contracting according to temperature changes along with said metal portions.

2. The resin molded electronic circuit device as defined in claim 1, wherein said coefficient of thermal expansion of said protection resin is equal to the coefficient of thermal expansion of said metal portions.

3. The resin-molded electronic circuit device according to claim 1, wherein said protection resin means forms the outermost layer of said device.

4. The resin molded electronic circuit device according to claim 1, wherein said protection resin means comprises:

a protection resin;

an inorganic powder added to said protection resin in an amount sufficient to adjust said coefficient of thermal expansion of said protection resin means to be substantially equal to said coefficient of thermal expansion of said metal portions, and to form said protection resin means in a sticky paste state for application to said electronic circuit device; and a setting agent mixed with said protection resin to fix said protection resin means around said electronic circuit device.

* * * * *